United States Patent
Chua et al.

(10) Patent No.: US 8,535,980 B2
(45) Date of Patent: Sep. 17, 2013

(54) METHOD FOR PRODUCING VIAS IN FAN-OUT WAFERS USING DRY FILM AND CONDUCTIVE PASTE, AND A CORRESPONDING SEMICONDUCTOR PACKAGE

(75) Inventors: Puay Gek Chua, Singapore (SG); Yonggang Jin, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 97 days.

(21) Appl. No.: 12/977,697

(22) Filed: Dec. 23, 2010

(65) Prior Publication Data

US 2012/0161332 A1    Jun. 28, 2012

(51) Int. Cl.
*H01L 21/00* (2006.01)

(52) U.S. Cl.
USPC ............................. 438/108; 408/113

(58) Field of Classification Search
USPC .................. 438/106–114, 610–618, E23.174, 438/E21.597, E21.508
See application file for complete search history.

(56) References Cited

U.S. PATENT DOCUMENTS

| | | | |
|---|---|---|---|
| 6,714,418 B2 | 3/2004 | Frankowsky et al. | |
| 7,598,607 B2 | 10/2009 | Chung et al. | |
| 7,842,541 B1 * | 11/2010 | Rusli et al. | 438/106 |
| 8,084,850 B2 * | 12/2011 | Shin | 257/684 |
| 2007/0096289 A1 * | 5/2007 | Enomoto et al. | 257/687 |
| 2011/0001247 A1 * | 1/2011 | Jobetto | 438/122 |

OTHER PUBLICATIONS

Yonggang Jin et al., "Method for Producing a Two-Sided Fan-Out Wafer Level Package With Electrically Conductive Interconnects, and a Corresponding Semiconductor Package," U.S. Appl. No. 13/173,991, filed Jun. 30, 2011, 29 pages.

* cited by examiner

*Primary Examiner* — Cuong Q Nguyen
(74) *Attorney, Agent, or Firm* — Seed IP Law Group PLLC (57) ABSTRACT

A process for manufacturing semiconductor packages is provided, that includes drilling blind apertures in a reconstituted wafer, adhering a dry film resist on the wafer over the apertures, and patterning the film to expose a space around each of the apertures. The apertures and spaces are then filled with conductive paste by wiping a quantity of the paste across a surface of the film so that paste is forced into the spaces and apertures. The spaces around the apertures define contact pads whose thickness is constrained by the thickness of the film, preferably to about 10 μm or less. To prevent paste from trapping air pockets in the apertures, the wiping process can be performed in a chamber from which much or all of the air has been evacuated. After curing the paste, the wafer is thinned from the back to expose the cured paste in the apertures.

19 Claims, 8 Drawing Sheets

METHOD FOR PRODUCING VIAS IN FAN-OUT WAFERS USING DRY FILM AND CONDUCTIVE PASTE, AND A CORRESPONDING SEMICONDUCTOR PACKAGE

BACKGROUND OF THE INVENTION

1. Technical Field

This disclosure is related to the manufacture of semiconductor devices, and in particular, the manufacture of fan-out wafer level packaging of semiconductor dies.

2. Description of the Related Art

Figure 1:
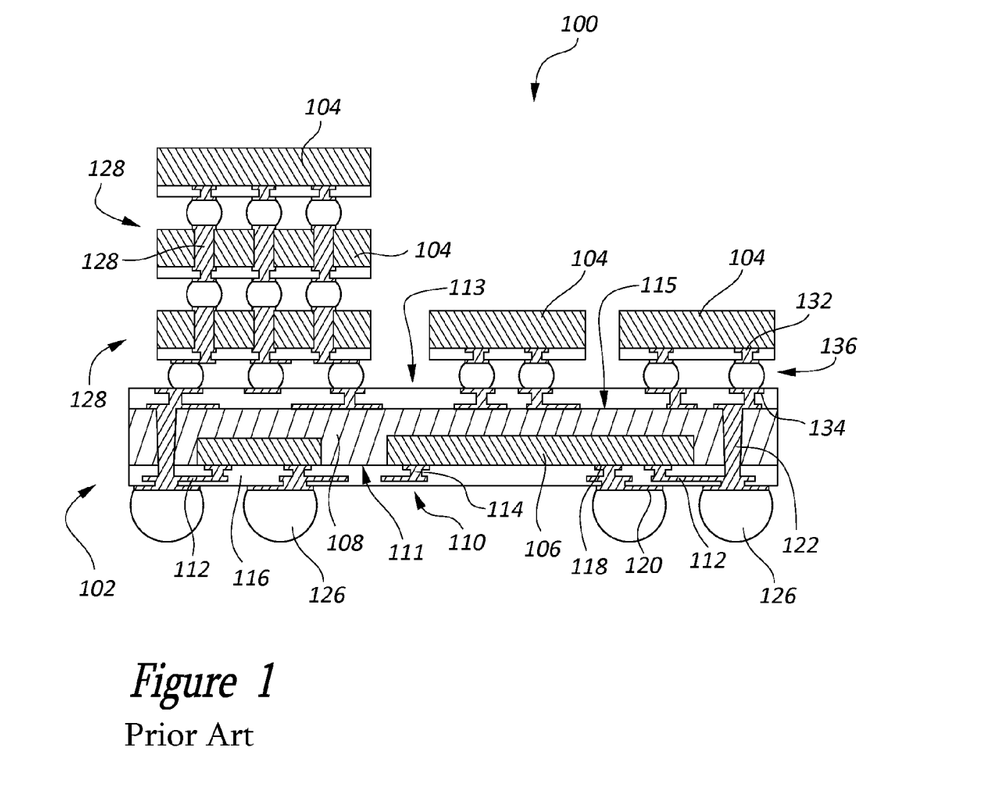
FIG. 1 is a cross sectional diagram of a package-on-package assembly including a fan-out wafer-level semiconductor package, according to known art.

Fan-out wafer-level packaging is a packaging process in which contacts of a semiconductor die are redistributed over a larger area. FIG. 1 shows a cross sectional diagram of a package-on-package (PoP) assembly 100 that includes a fan-out wafer level package (FOWLP) 102 and a plurality of additional semiconductor devices 104 coupled thereto.

The FOWLP includes a semiconductor die 106 embedded in a molding compound layer (MCL) 108, with a first redistribution layer 110 positioned on a first face 111 of the MCL and a second redistribution layer 113 positioned on the opposing second face 115. The first redistribution layer 110 comprises a plurality of electrical traces 112 and vias 114 separated by dielectric material 116, which place contact pads 118 of the die 106 in electrical contact with contact pads 120 of the package 102. Additionally, through-wafer vias (TWV) 122 in the MCL 108 place various of the plurality of electrical traces 112 in electrical contact with corresponding elements of the second redistribution layer 113. A first ball grid array (BGA) comprises a plurality of solder balls 126 positioned on respective ones of the contact pads 120, which, during a reflow process, will serve to electrically and mechanically couple the package 102 to a printed circuit board.

In the example of FIG. 1, the plurality of additional semiconductor devices 104 includes devices 128 in which through-silicon vias (TSV) 130 are provided according to known processes. Each of the additional semiconductor devices 104 is provided with a respective BGA 136 to couple contact pads 132 of that device to contact pads 134 of the device on which it is positioned.

Configurations like the PoP assembly 100 of FIG. 1 provide a number of advantages over traditionally packaged devices, including reduced manufacturing costs and reduced size. Such packaging is particularly beneficial in very small and complex electronic devices, including, for example, cell phones and "smart" phones.

Referring again to the FOWLP 102 of FIG. 1, in manufacturing these devices, a number of processes are known for use in providing the TWVs 122 in the MCL 108. According to one method, conductive bumps are printed onto a carrier substrate on which the semiconductor material die 106 is later positioned, and both are then embedded in molding compound. This process is described in detail in U.S. Pat. No. 6,714,418.

According to another method, TWVs are formed using techniques similar to those commonly used to form plated through-holes in printed circuit boards, as described, for example, in U.S. Pat. No. 7,598,607.

Dry film resist is a photosensitive film that is most commonly used in the manufacture of printed circuit boards as a plating mold in the process of depositing copper wiring patterns. Dry film resist is available in a wide range of thicknesses and formulations, typically consisting of three layers: a polyester support layer, a resist layer, and a polyethylene cover layer.

In use, the polyethylene cover layer is first removed, then the film is positioned with the resist side against a substrate, e.g., a resin substrate for a circuit board, under even pressure and a temperature of around 100 degrees C., to cause the resist layer to adhere to the surface of the substrate. The film is commonly applied using a roller or a vacuum press to apply the pressure. A mask is then positioned over the (transparent) polyester support layer of the film and the film is exposed to a light source. In the case of a positive-acting film, the portions of the film that are exposed to the light will dissolve and wash away during a subsequent developing process, and in the case of a negative acting film, the non-exposed portions will be removed during developing. After exposure to the light, the mask is removed, and the polyester support layer is peeled away, leaving the resist layer on the surface of the substrate. The resist layer is developed, by a process that varies according to the variety of film used, to remove the portion of the resist layer that is not desired, leaving the patterned layer behind. Where the dry film resist is used as a plating resist, a seed layer is typically deposited on the substrate prior to deposition of the film. After the film layer is patterned, the substrate is electroplated with copper, which adheres to the substrate at the locations where removal of the resist layer has exposed the seed layer. following the plating step, the resist layer is removed, leaving a copper circuit pattern formed on the substrate of the circuit board. Lastly, a short etch step removes a thickness of copper slightly in excess of the thickness of the seed layer, which is thereby removed from the substrate.

Dry film resist is also occasionally used as an etch resist when circuit boards are made by a subtractive process, and has also been investigated experimentally for use as a plating mold in the manufacture of MEMS devices. Dry film resist is commonly available in thicknesses (of the resist layer) ranging from around 15 to 75 μm (microns), with thicknesses up to around 200 μm being used in the MEMS investigations.

Electrically conductive paste is a polymeric material that includes a conductive ingredient. It is sometimes used in the manufacture of printed circuit boards (PCB) to fill through-holes and blind vias. Conductive paste is typically applied via screen printing, metal foil stencil, roller coating, or with a doctor blade. A vacuum assist is often used to draw the paste through the holes. In this manner, holes having high aspect ratios can be filled. Where conductive paste is used to fill blind vias, the aspect ratio of the holes must be low, generally less than 1:1, to permit the paste to fill the holes without trapping significant quantities of air. Deposition of conductive paste typically leaves a bump or blob of paste on one or both faces of a board or layer, so except where such a bump will not interfere with subsequent assembly steps, circuit boards or lamina are either wiped clean, if that can be done prior to curing the paste, or they are planarized or polished after curing.

BRIEF SUMMARY

According to an embodiment, a process for manufacturing semiconductor packages includes drilling a plurality of blind apertures into a top surface of a reconstituted wafer in which a plurality of semiconductor dies are embedded, depositing a dry film resist on the top surface of the reconstituted wafer over the blind apertures, patterning the dry film resist to expose the blind apertures; and filling the blind apertures with conductive paste. In patterning the dry film resist, openings can be formed to define contact pads of conductive paste on the top surface of the reconstituted wafer over respective apertures.

The blind apertures in the reconstituted wafer and the openings of the dry film resist are filled by wiping a quantity of conductive paste across a surface of the dry film resist so that paste is forced into the openings and apertures. The thickness of the contact pads on the top surface is defined by the thickness of a resist layer of the dry film resist, and is preferably less than about 40 μm, more preferably less than about 20 μm, and most preferably equal to or less than about 10 μm.

In order to fill the blind apertures with conductive paste, the wiping process can be performed in a chamber from which much or all of the air has been evacuated. This prevents formation of trapped air pockets in the apertures so that the paste can be easily forced to the bottoms of the apertures. A redistribution layer is formed on the top surface of the wafer to electrically couple the contact pads over the blind apertures with contact pads of the semiconductor material dice.

After the conductive paste has been cured, the reconstituted wafer is thinned by removing material from a bottom side of the wafer. Sufficient material is removed to expose the bottom ends of the blind apertures and the cured conductive paste within. A redistribution layer, or at least contact pads are positioned on the bottom surface of the wafer to provide electrical access to the semiconductor devices formed on the dice, via the cured conductive paste in the apertures.

According to another embodiment, a process for manufacturing a semiconductor package includes adhering, over a top surface of a semiconductor wafer, a sheet of dry film resist, patterning the sheet to define a plurality of openings in a resist layer of the sheet, removing a backing layer of the sheet of dry film resist, leaving the resist layer on the top surface, drawing a quantity of electrically conductive paste across the wafer over the resist layer and wiping a surface of the resist layer so as to force conductive paste to fill each of the plurality of openings while leaving the surface of the resist layer substantially clean of the conductive paste, curing the conductive paste in each of the plurality of openings, and removing the resist layer from the top surface while leaving a plurality of segments of cured conductive paste on the top surface, the segments having respective shapes as imposed by shapes of the respective ones of the plurality of openings, and having a thickness imposed by a thickness of the resist layer.

According to another embodiment, A semiconductor package is provided, which includes a semiconductor die embedded in a package layer of cured molding compound, a first plurality of contact pads positioned on a top surface of the semiconductor die, a plurality of apertures extending through the package layer from a top face corresponding to the top surface of the semiconductor die to a bottom face of the package layer opposite the top face, a plurality of conductive posts positioned in respective ones of the plurality of apertures and composed of cured electrically conductive paste, and a second plurality of contact pads on the top face of the package layer and positioned over top ends of respective ones of the plurality of conductive posts, each of the second plurality of contact pads being composed of cured electrically conductive paste.

A first redistribution layer is positioned on the top face of the package layer over the first and second pluralities of contact pads and includes a first plurality of electrical traces placing ones of the first plurality of contact pads in electrical contact with respective ones of the second plurality of contact pads. Each of the second plurality of contact pads has a thickness, preferably, that is not greater than about 10 microns.

A third plurality of contact pads is positioned on the bottom face of the package layer, each in electrical contact with a bottom end of a respective one of the plurality of conductive posts.

DETAILED DESCRIPTION

A process for the manufacture of a FOWLP according to principles of the present invention is described with reference to FIGS. 2-15. Prior to the packaging process described below, a semiconductor wafer is processed according to known methods to form integrated circuits and other devices. Typically, such circuits are formed in a single face of the wafer, which is typically referred to as the top face or front face, and the opposite face as the bottom face, also sometimes called the backside.

Figure 2:
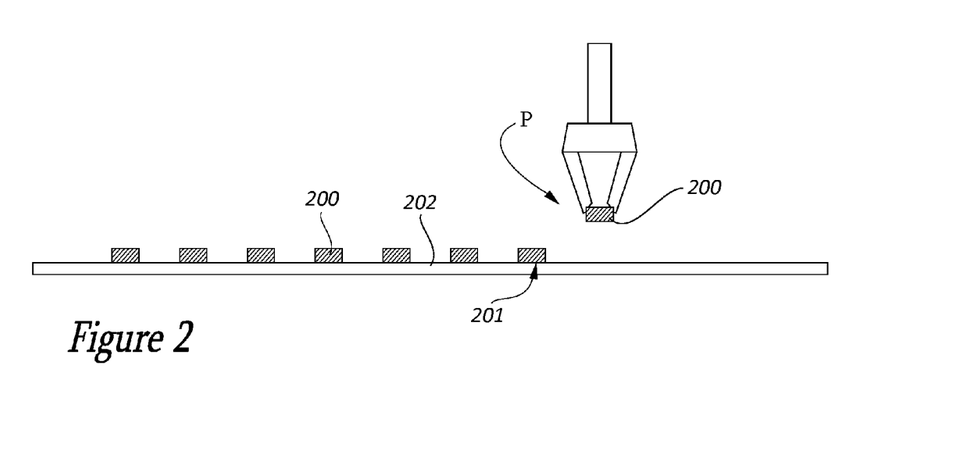
FIGS. 2-14 are cross-sectional diagrams showing respective stages or process steps in a method of manufacturing a fan-out wafer-level semiconductor package, according to various embodiments.

When processing of the semiconductor wafer is complete, the wafer is cut into individual dice 200, each of which includes a respective plurality of contact pads on its top face 201, for electrical contact with the circuit or system integrated therein. Referring first to FIG. 2, the individual dice 200 are positioned top face 201 down on a carrier sheet 202 that has an adhesive surface, using a "pick-and-place" operation P, in which each die is precisely positioned relative to the other dice on the carrier 202. The adhesive surface holds the dice in their respective positions during subsequent process steps.

Figure 3:
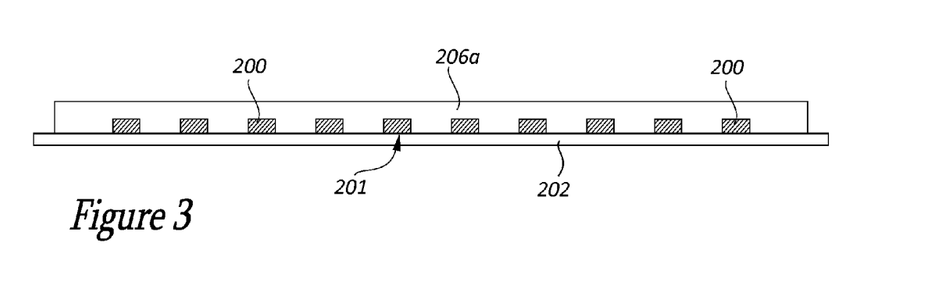
Figure 4:
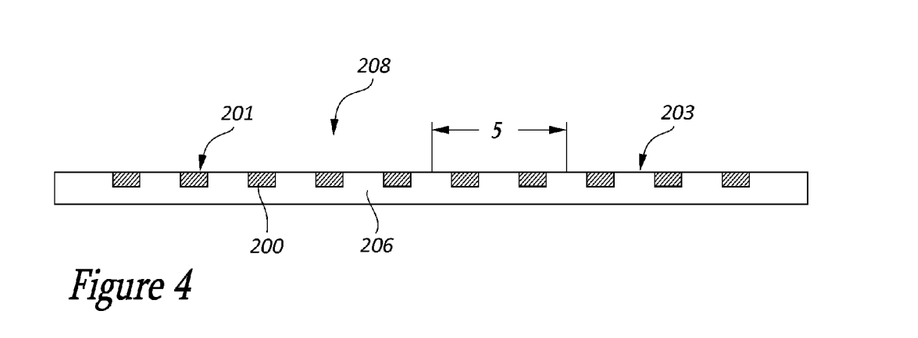

As shown in FIG. 3, a reconstituted wafer 208 is made by depositing a molding compound 206a over the dice 200 on the carrier sheet 202, which is cured under pressure to form a molding compound layer (MCL) 206 that is the primary substrate of the reconstituted wafer 208. After the molding compound is cured, the carrier sheet 202 is removed, as shown in FIG. 4, leaving the top faces 201 of the dice exposed and lying substantially in a common plane with a top face 203 of the reconstituted wafer 208. A reconstituted wafer can be made in any shape or size, depending on the number, spacing, and arrangement of the dice on the carrier sheet, but typically is made to conform in size and shape to a standard semiconductor material wafer, so that equipment designed for transporting and processing semiconductor wafers can be used to process reconstituted wafers that have semiconductor material dice embedded in a MCL.

Figure 5:
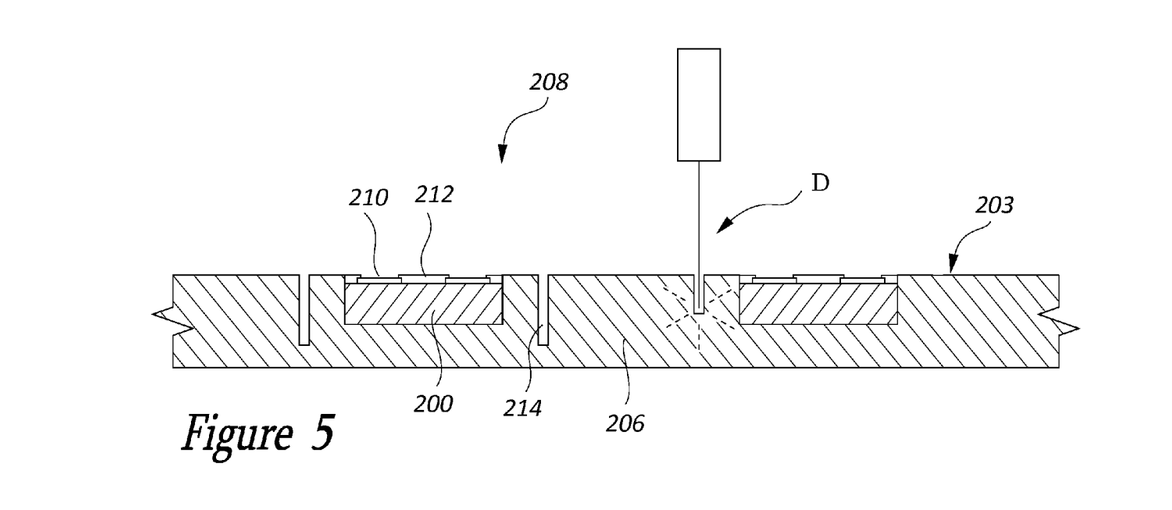

FIGS. 5-13 show, in an enlarged view, a small portion of the reconstituted wafer 208 corresponding, approximately, to the portion between the lines indicated at 5 in FIG. 4. In FIG. 5, dice 200 are shown, each having a plurality of contact pads 210 and a passivation layer 212. After removal of the carrier 202, blind apertures 214 are drilled into the MCL 206. The apertures 214 can be formed by laser drilling 216, as shown in FIG. 5 at D, or by any other appropriate process, including chemical, mechanical, or electrical processes. The apertures are preferably on the order of 5-15 μm in diameter, but may be either larger or smaller, as required. Depth of the apertures is determined according to the requirements of the particular use. Typically, the apertures have a depth that exceeds a thickness of the semiconductor dies 200, and may be, for example, 100-300 μm in depth. Thus, the aspect ratio of the blind apertures 214 will usually be greater than 5:1, and may exceed 60:1.

Figure 6:
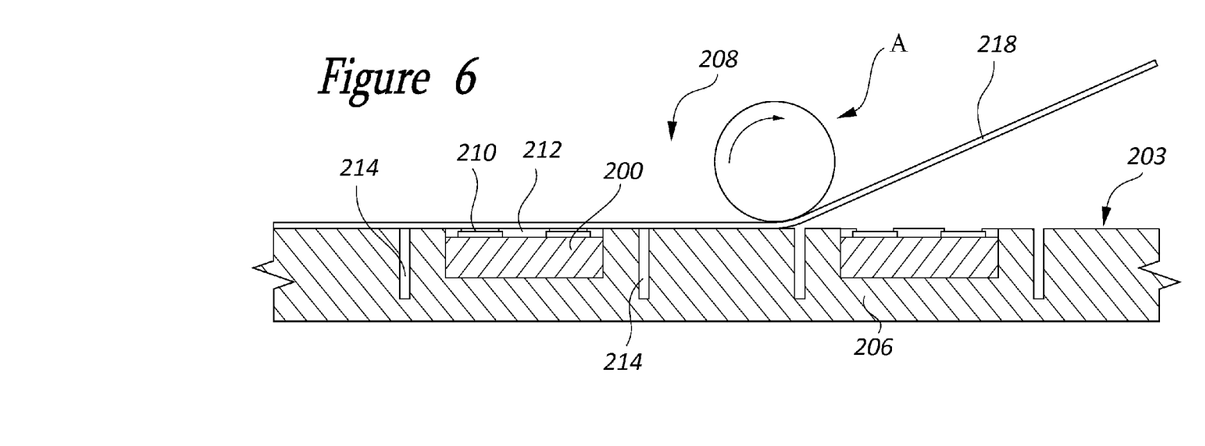

Following the laser drilling, a dry film layer 218 is adhered to the top face 203 of the reconstituted wafer 208. According to one method, the dry film 218 is adhered via a rolling process, as depicted in FIG. 6 at A, in which a heated roller applies a controlled pressure to simultaneously warm and press the resist layer of the dry film 218 onto the top surface 203 of the reconstituted wafer 208. According to an alternative process, the film 218 is applied by a vacuum process, in which, with the wafer 208 lying top face up on a planar surface, the film 218 is placed over the wafer, and a sheet of highly conformable elastomeric material, such as, e.g., synthetic rubber, is placed over the film. The sheet of elastomeric material is sealed around its perimeter to the planar surface, and air is drawn out of the space between the elastomeric layer and the planar surface by a vacuum pump. As air is evacuated, the layer of elastomeric material is pressed down onto the top surface of the wafer 218 by atmospheric pressure, compressing the layer of dry film 218 against the top surface 203 of the wafer 208. Heat, if required, can be applied by infrared lamps, by heating the planar surface, or by other appropriate means. Some kinds of dry film resist may not require heat for proper adhesion. Both of these methods are known for applying dry film to circuit board substrates.

Figure 7:
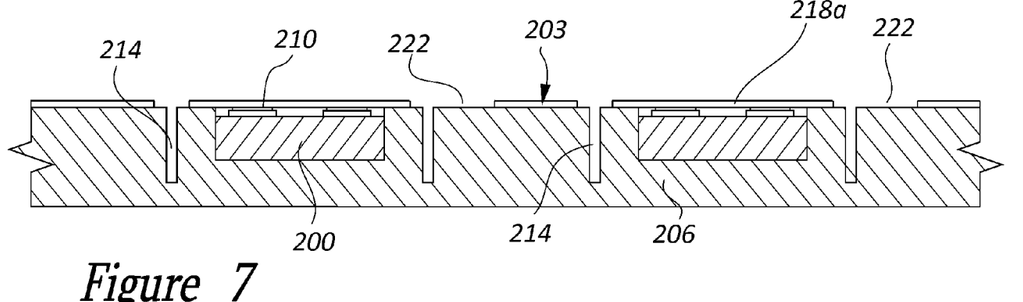

After the dry film resist 218 is adhered to the reconstituted wafer 208, a mask is positioned over the film and the film is exposed through the mask to a light source of an intensity and for a time period that are sufficient to define a selected pattern in the resist layer of the film. The polyester backing of the dry film resist 218 is then removed, and the resist layer 218a that remains on the wafer 208 is processed appropriately to form openings 222 in the resist layer, as best shown in FIG. 7. The mask that is positioned over the film prior to the exposure step is positioned and configured such that processing the film results in formation of openings 222 in the resist layer 218a positioned over respective ones of the blind apertures 214. Dry film resist has the capacity to "tent" over small voids and apertures, so following the application, exposure, and processing of the film, cavities, voids, or apertures in the wafer 208, except those corresponding to openings 222 defined by the mask, are protected by the dry film 218.

Figure 8:
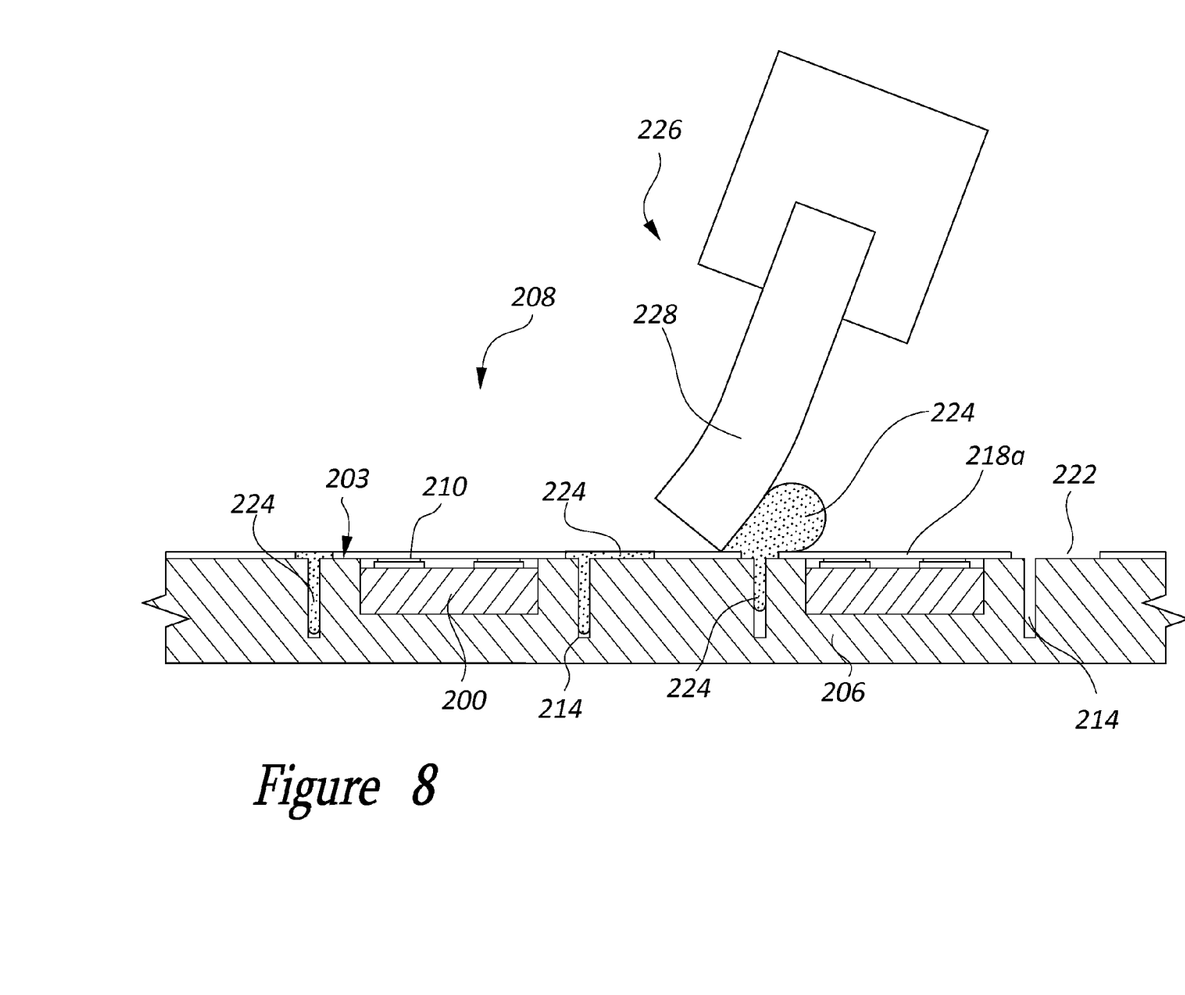

As shown in FIG. 8, a quantity of conductive paste 224 is placed on the top face 203 of the wafer 208 over the resist layer 218a of the dry film. A squeegee 226 with a resilient elastomeric blade 228 is drawn across the top face 203 of the wafer 208, pulling a bead of conductive paste 224 across the face. A sharp edge of the blade 228 acts as a wiper to leave the top of the resist layer 218a substantially clean except where the paste 224 is drawn across the openings 222 in the resist layer. At these locations, the conductive paste 224 is forced into the openings 222 and down into the blind apertures 214 by the action of the squeegee 226.

It will be recognized that in forcing the conductive paste 224 into the blind apertures 214, an air pocket would normally be trapped within each aperture, preventing the paste from penetrating more than a small distance. In order to overcome this problem, the operation in which the paste 224 is applied to the reconstituted wafer 208 is performed in a low-pressure environment. The paste 224 is applied to the wafer 208 in a chamber from which the air is first evacuated, preferably reducing the atmospheric pressure effectively to zero. Thus, there is little or no air to be trapped within the apertures 214, so the paste 224 can be forced into the apertures without trapping air pockets. Additionally, if the wafer 208 is subjected to normal atmospheric pressure before the paste 224 is cured, and if the paste has not penetrated to the bottom of each aperture 222, the return to normal pressure will result in an imbalance of pressure in the apertures, forcing the conductive paste toward the bottom of each aperture. If this results in cavities forming at the tops of the apertures in the uncured paste, the paste application process can be repeated to fill those cavities.

After the conductive paste 224 is loaded into the apertures 222, the paste is cured and hardened to form a conductive post 230. Typically, the conductive paste 224 is formulated using a thermosetting polymer, so curing the paste is accomplished by application of heat. Alternatively, the paste 224 may be a thermoplastic material that is melted prior to application and that re-hardens upon cooling, or it may cure in reaction to a catalyst that is mixed just prior to application, or by oxidation through contact with air.

Figure 9:
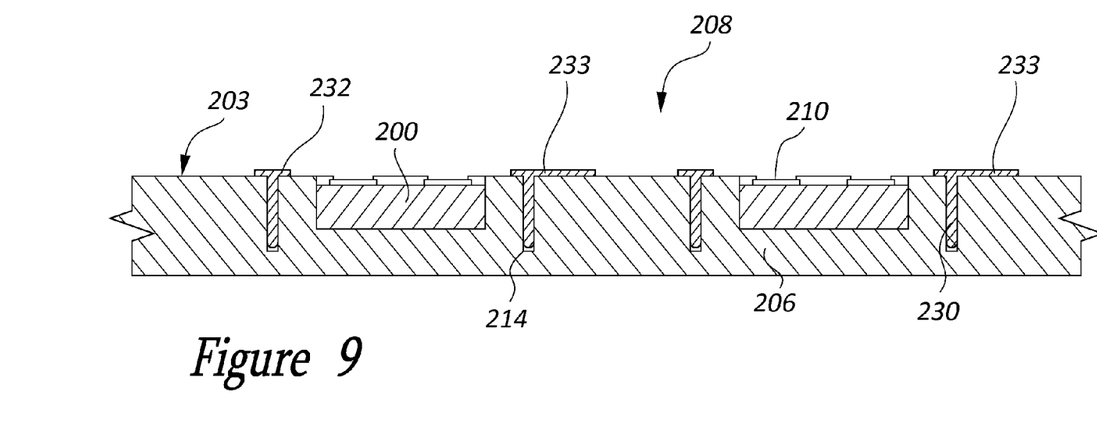

Once the conductive paste 224 in the apertures 222 has cured, the dry film resist 218 is removed using the appropriate solvent or agent, as prescribed by the manufacturer. Lands 232, which will serve as electrical contact pads, are formed by the paste 224 on the top surface 203, as defined by the openings 222 of the dry film resist, as shown in FIGS. 8 and 9. Each of the lands 232 is in electrical contact with the conductive post 230 in the respective one of the apertures 222. In a preferred embodiment, each land 232 and respective conductive post 230 form a single conductive element with a top portion 232 at the surface of the reconstituted wafer 208. In addition to defining the lands 232, the dry film resist can be patterned to define electrical traces 233 on the top surface of the wafer 208, as may be desired for any particular circuit connection or design. Because the edge of the squeegee used to apply the conductive paste 224 is substantially straight, and the resist layer 218a of the dry film resist is manufactured to be, within acceptable tolerances, a single thickness throughout, the lands 232 and traces 233 are very closely constrained to a thickness above the top surface 203 that is substantially equal to the thickness of the resist layer, which provides particular benefits, as discussed later.

Figure 10:
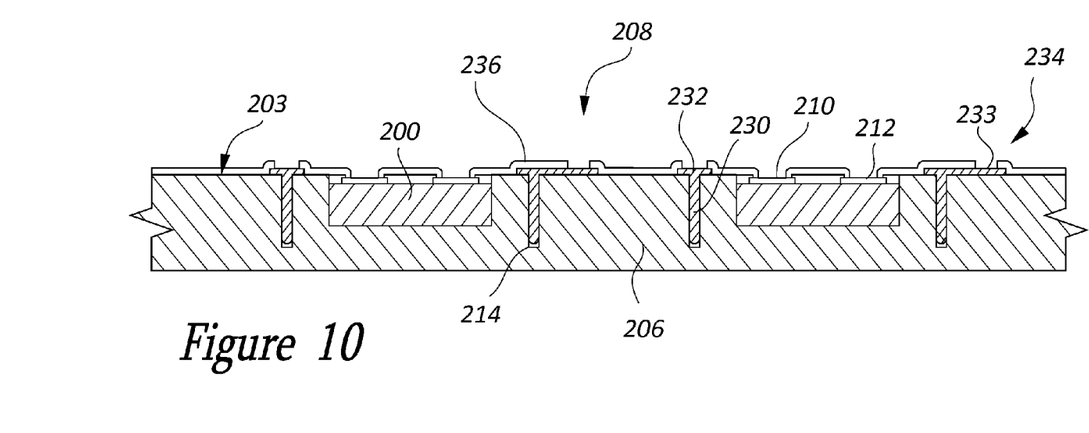
Figure 11:
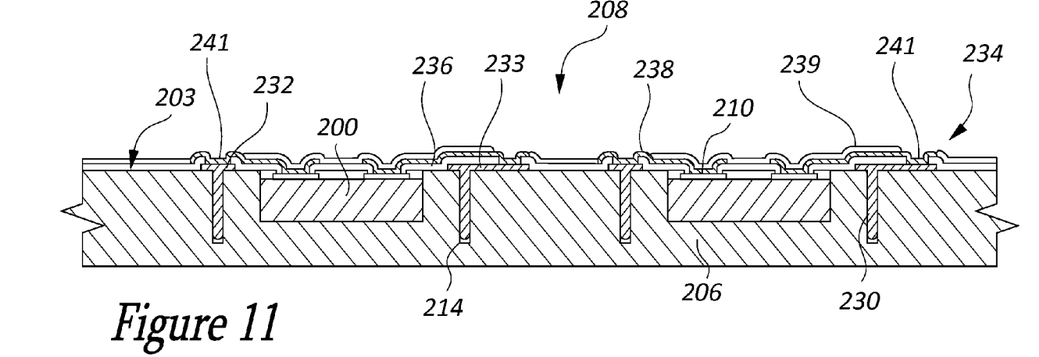

Following removal of the dry film layer, a first redistribution layer (RDL) 234 is formed on the top face of the wafer 208 using processes that are well known in the art. As shown in FIG. 10, a first dielectric layer 236 is deposited, and patterned to provide openings for contacts of a subsequent layer with the lands 232 and contact pads 210. As shown in FIG. 11, a conductive layer 238 is then deposited over the first dielectric layer 236, and patterned to form a plurality of electrical traces 238 electrically coupling the lands 232 to respective ones of the contact pads 210 of the semiconductor dice 200, and to form metalized bonding pads 241. In the example shown, the metalized bonding pads 241 are positioned directly over the lands 232 so that each contact pad 210 is electrically connected to a conductive post 230, but this is not essential. The contacts can be "redistributed" to conform to any desired configuration, by providing the desired electrical traces. A second dielectric layer 239 is also deposited over the metallic layer 238 and patterned to cover all but the metalized bonding pads 241. The first RDL 234 is further processed according to the particular requirements of the device, and according to well known processes. These processes can include deposition of additional dielectric and metal layers, formation of passive components, contact pads, ball grid arrays, etc. The arrangement of the elements of the wafer 208 and first RDL 234 is for the purpose of illustration and example only. In actual practice, the elements will be configured according to a particular application, and will certainly differ significantly from the arrangement shown.

Figure 12:
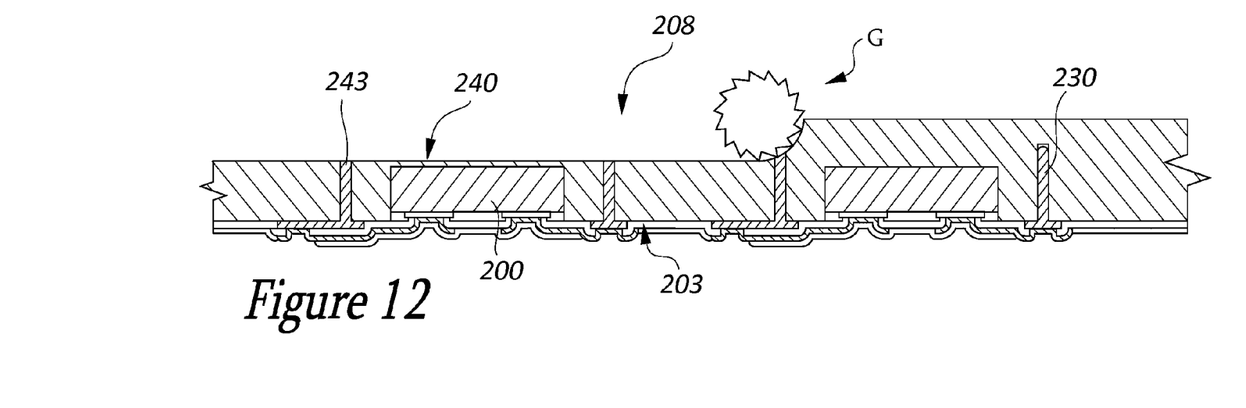

Following the curing of the conductive paste 224 in the blind apertures 222, a bottom side of the reconstituted wafer 208 is thinned sufficient to expose the apertures 222 and bottom ends 243 of the conductive posts 230, and to provide a new bottom face 240, as shown in FIG. 12. The thinning process can be performed using any appropriate process or combination of processes, such as are well known in the art. For example, the reconstituted wafer can be thinned by polishing, CMP, milling, etching, grinding or any acceptable technique. The diagram of FIG. 12 depicts a mechanical grinding process G, but this is merely exemplary.

Figure 13:
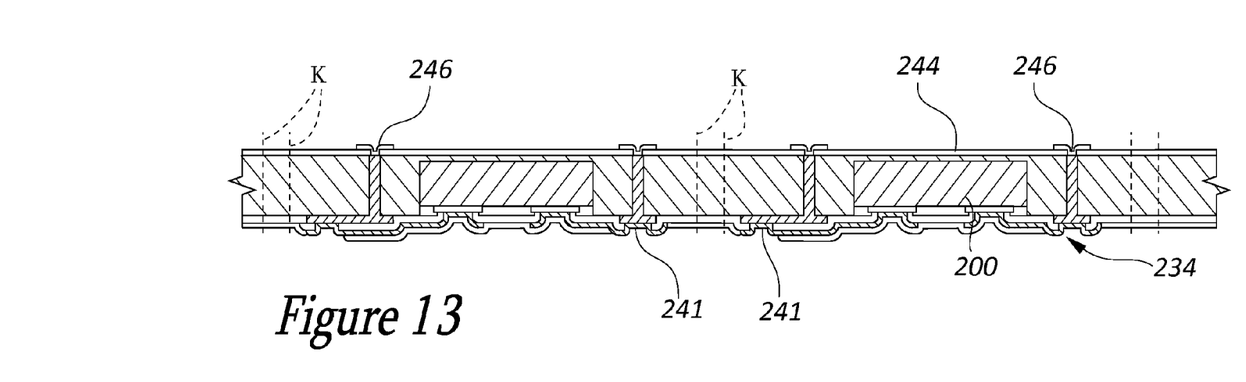

As shown in FIG. 13, the bottom face 240 is processed to form landing pads, 246 or other types of contact pads configured to electrically connect to circuits adjacent the bottom face 240. For example, to receive solder balls from one or more flip chips positioned on that side of the device. FIG. 13 shows a representative dielectric layer 244 and landing pads 246 in electrical contact with the bottom ends 243 of the conductive posts 230, which can now function as through-wafer-vias. It will be recognized that the arrangement shown is merely exemplary. If necessary, a second RDL 242 can be formed on the bottom face to redistribute connections to the conductive posts 230, or for any other purpose using known processes. FIG. 13 also shows pairs of kerf lines K that define between them the kerf of a saw used to singulate the reconstituted wafer 208.

Figure 14:
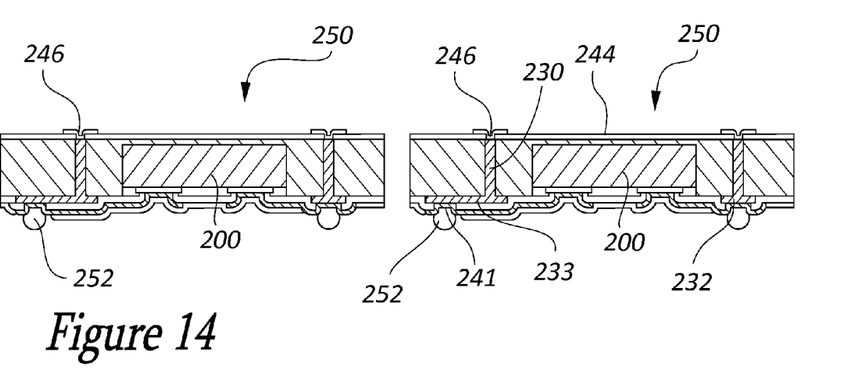

In one embodiment, the final step before singulation is formation of a plurality of solder balls 252 on one or more of the bonding pads 241 on the wafer 208, to form a ball grid array on the top face 203 of the wafer. When all process steps are complete, the wafer 208 is cut into completed packages 250, as shown in FIG. 14.

The processes performed on the bottom face 240 of the wafer 208, as described with reference to FIGS. 12 and 13, can be performed before, after, or concurrently with any or all of the processes described as following the curing step, with reference to FIGS. 8-11. It may be advantageous to perform similar processes on opposite faces of the reconstituted wafer 208 substantially simultaneously, such as, for example, plating or etching processes. On the other hand, it may be preferable to complete all processes on one side of the wafer 208 prior to reversing the wafer to work on the opposite face. Accordingly, except where the relative order of steps is inherent in the process, or where they are explicitly defined in the claims, the claimed methods are not limited to the order in which their steps are set forth.

The process described above and shown in the drawings provides blind apertures that are filled with conductive paste. According to another embodiment, through apertures are formed and filled with conductive paste. The bottom face of the wafer then requires polishing or thinning only to the extent necessary to remove any cured paste that was extruded from the apertures prior to curing. The remaining processes of the method are substantially as described above.

Figure 15:
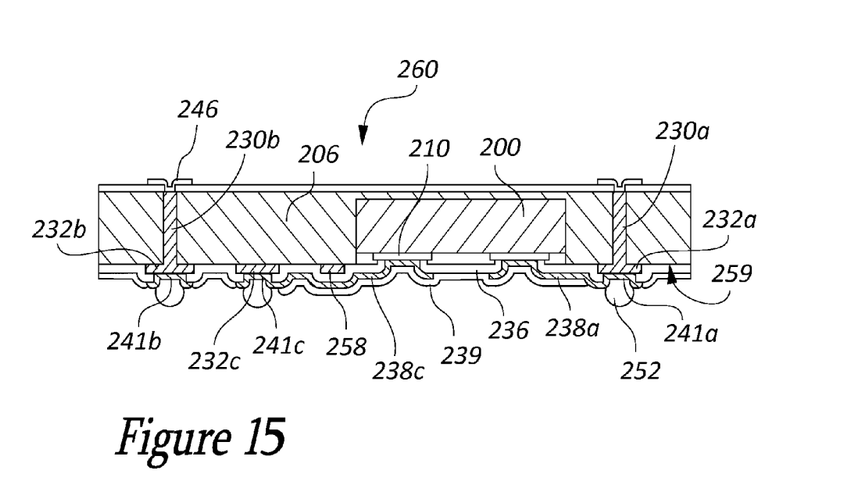
FIG. 15 is a cross-sectional diagram of a fan-out wafer-level semiconductor package showing additional features according to various embodiments.

While principles of the invention are described with reference to the structures illustrated in FIGS. 2-14, it will be recognized that embodiments are not limited to the specific structures disclosed. FIG. 15 shows a fan-out wafer-level semiconductor package 260 that includes some others of the various possible configurations according to other embodiments. As shown in FIG. 15, a first through-wafer-via 230a is configured substantially as described above, with a corresponding land 232a coupled to a first metallic bonding pad 241a and to a contact pad 210 of the semiconductor die 200 by a first electrically conductive trace 238a. A second through-wafer-via 230b and corresponding land 232b, while formed as described above, is not in electrical contact with a contact pad of the semiconductor die, but is configured to place a metalized bonding pad 241b in electrical contact with a corresponding one of the landing pads 246 on the back surface of the device, to provide a through connection for another device positioned over the FOWLP 260. A third land 232c is formed in the same process that is used to form the posts 230 and corresponding lands 232, but is not in electrical contact with a conductive post, but is instead formed on the surface 259 of the MCL 206, and is in electrical contact with a metallic bonding pad 241, and with a contact pad 210 of the semiconductor die via a conductive trace 238c.

Finally, a conductive trace 258 is positioned on the surface 259 of the MCL 206, formed of cured conductive paste in the same process that is used to form, e.g., the lands 232. In the device 260 pictured, the conductive trace 258 extends through the plane of the image, while the conductive trace 238c bridges over the trace 258, with the dielectric layer 236 interposed, in order to couple the land 232 to the contact pad 210. Traces formed of conductive paste can be used to advantage especially in situations where it is necessary or desirable to cross one electrical path with another without making contact, as in the example shown. Such traces add no addition expense to the process, and can eliminate or reduce the added expense of depositing additional conductive and dielectric layers over the dielectric layer 239.

In making a RDL, it is generally desirable to keep the thickness of the dielectric layers to less than about 10 µm, for reasons of reliability and economy. However, when forming a dielectric layer over a metallization layer or other conductive layer, it is desirable that the thickness of the dielectric layer be equal to, or, preferably, greater than the thickness of the conductive layer. This simplifies formation of the dielectric layer and significantly reduces the likelihood of failures in the dielectric layer at the edges of the segments of the conductive layer. Thus, in the present example, the lands 232 and electrical traces 233 on the top face 203 of the wafer 208 should be no thicker than the dielectric layer 236, and should, preferably, be equal to or less than about 10 µm. As noted in the background, conductive paste is typically used in PCB manufacture, but is not generally associated with semiconductor device packaging. Of the processes commonly used to apply conductive paste to a circuit board substrate, none are known to be capable of depositing a layer as thin as 10 µm in defined locations or patterns. The thinnest deposits are achieved using metal foil stencils, but for practical purposes, the minimum thickness of a metal foil stencil is no thinner than around 40-50 µm, which produces a paste deposit of an equivalent thickness. A thinner stencil is too fragile to withstand the handling and the application process, but would wrinkle and fold during handling and use. Screen process printing, which is probably the most economical process for depositing paste, employs a fine steel mesh under high tension, which is impregnated with a photosensitive stencil that is patterned to create open areas where the paste can be forced through the mesh. The thickness of the deposit is controlled by the combined thickness of the mesh and the stencil. A minimum deposit thickness, using current screen process printing technology is in the range of about 75-150 µm. Furthermore, there is little motivation to achieve thinner deposits of conductive paste in PCB manufacture, because it is routine, where conductive paste is used to fill vias in circuit board substrates, to planarize or polish the substrate following paste deposition and cure, to remove unwanted deposits or residue of the paste from the surface of the substrates. This is not an option in the case of the process described above, because grinding or polishing the top face of the wafer 208 would almost certainly damage the top faces 201 of the semiconductor dice 200. Given limitations such as those associated with the customary methods of applications, electrically conductive paste has not previously been considered of particular value in the production of wafer-level packaging of semiconductor devices.

While dry film resist is most commonly used as a plating resist for circuit board manufacture, and for that purpose generally ranges from about 15-75 μm, some manufacturers produce dry film with a resist layer thickness of 5-10 μm. When used as a plating resist, the thickness of the resist layer defines a practical limit to the useful thickness of the plating but does not define the actual thickness; e.g., a plated copper wiring circuit would not normally be thicker than the film used to define the pattern, because a thicker deposit would mushroom over the top of the film and lose detail. However, film thickness does not constrain the plating deposit to any thickness, which is instead controlled by the selection of the plating process and its duration. The plating process can be terminated when the plating thickness is a small fraction of the thickness of the film, or could be permitted to proceed to a thickness much greater than the film thickness, notwithstanding the fact that doing so would probably ruin the corresponding circuit board. Likewise, when used as an etch resist, film thickness has no relation to the thickness of the material to be etched, which is determined before the film is applied, or to the depth of the etch, which again is a factor of the particular process and duration.

Instead, thinner film is desirable because it can reduce light scatter during exposure and thereby produce a sharper and more faithful copy of the masking image. On the other hand, thicker film is desirable because it permits a greater plating thickness, can have wider processing tolerances, and can be more durable and resistant to damage during transport, storage, and processing. Thus, while manufacturers are motivated to produce films of different thicknesses to meet various customer preferences, film thickness has not previously been associated with controlling a thickness of a layer of material that is processed using the film.

In the case of the dry film resist used in the process described with respect to FIGS. 6-9, the passage of the squeegee 226 over the resist layer 218a leaves the paste 224 in the openings 222 approximately equal in thickness to the resist layer of the film. Therefore, by using film in the range of 5-10 μm, it is possible to form the lands 232 and traces 233 with thicknesses that are less than or equal to the nominal 10 μm thickness of the dielectric layer, which permits formation of a reliable dielectric layer at a commonly preferred thickness.

Given the previous unrelated uses of dry film resist and electrically conductive paste, it is surprising and unexpected to find that conductive paste can be reliably deposited on a planar surface at thicknesses of less than about 40 μm and, particularly, less than about 10 μm, or that it can be used in formation of a redistribution layer or via in a fan-out wafer-level semiconductor package. It is unexpected to find that dry film resist can be used in manufacturing semiconductor packages, or that it can be used to regulate the thickness of a conductive layer on a substrate. It is unexpected to find that dry film resist can be used to define the thickness and pattern of a layer of conductive paste. Additionally, with regard to the process of depositing the conductive paste, and in view of the known limitations, it is unexpected to find that conductive paste can be deposited to substantially fill high aspect-ratio blind apertures.

Devices that are formed on semiconductor material substrates are generally formed on only one surface thereof, and actually occupy a very small part of the total thickness of the substrate. This surface is generally referred to as the active, front, top, or upper surface. Likewise, for the purposes of the present disclosure and claims, the terms top and bottom are used to establish an orientation with reference to a semiconductor wafer or die. For example, where a device includes a semiconductor die, reference to a top surface of some element of the device can be understood as referring to the surface of that element that would be uppermost if the device as a whole were oriented so that the active surface of the die was the uppermost part of the die. Of course, a bottom or back surface of an element is the surface that would be lowermost, given the same orientation of the device. Use of either term in the claims to refer to an element of such a device is not to be construed as indicating an actual physical orientation of the element, the device, or the associated semiconductor component, and, where used in a claim, does not limit the claim except as explained above.

The term over is used in the specification and claims to refer to the relative positions of two or more elements with respect to a third element, although the third element may be implied by the context. The term on is used to refer to a physical relationship between two elements. Neither term should be construed as requiring direct physical contact between the elements, nor should they be construed as indicating any particular orientation, either absolute, or with respect to the third element. So, for example, if a claim recites a second layer positioned over a first layer on a substrate, this phrase indicates that the second layer is coupled to the substrate and that the first layer is between the second layer and the substrate. It does not indicate that the layers are necessarily in direct physical contact with each other or with the substrate, but may instead have one or more intervening layers or structures. It also does not indicate that the substrate is oriented in a manner that places the second layer physically above the first layer, nor that, for example, the layers are positioned over a top face of the substrate, as that term is used herein.

The term patterning is commonly used in the art to refer to any of a number of subtractive processes used to define a specific image or pattern in a layer. According to one process, for example, a metallic layer is deposited on a substrate, a positive-acting photosensitive etch resist layer is deposited over the metallic layer, a photo mask is positioned over the resist layer, and the resist layer is exposed through the mask to a light source for a prescribed period, so that some portions of the resist layer are prevented from being exposed by the image of the mask. The resist layer is processed to remove the exposed portions of the layer, which in turn exposes the surface of the metallic layer at those locations. The substrate is processed in a chemical that dissolves the material of the metallic layer, so that the exposed portions of the metallic layer are removed. Lastly, the resist layer is removed, leaving portions of the metallic layer in the form of the image. This process is one of many different processes by which an object or layer can be patterned, and in many cases, the selection of one process over another is merely a design choice, where any of several processes would be satisfactory. Because such processes are generally well known and understood, they are not described in detail where the choice of process is not material to the disclosure.

Ordinal numbers are used in the specification and claims to distinguish between elements so referenced. There is no necessary significance to the value of a number assigned to one element relative to other numbered elements. Furthermore, an ordinal number used to refer to an element in the claims does not necessarily correlate to a number used to refer to an element in the specification on which the claim reads.

The aspect ratio of an aperture is the depth of the aperture relative to its width or diameter. An aspect ratio of greater than 1:1 is typically referred to as a high aspect ratio, while a low aspect ratio is a ratio of less than 1:1.

The term couple, as used in the claims, includes within its scope indirect coupling, such as when two elements are coupled with one or more intervening elements, even where no intervening elements are recited.

Molding compounds are substances used to encapsulate semiconductor devices in many different packaging processes, are typically composite materials made from blends of ingredients such as, e.g., resins, hardeners, silicas, catalysts, pigments, and release agents, and are generally provided in a substantially liquid form of a selected viscosity so that they can be injected or poured. Molding compounds are available in a very wide range of formulations from different manufacturers and to meet many different criteria. Accordingly, the term molding compound is to be construed broadly to apply to all such compounds.

The unit symbol "μm" is used herein to refer to a value in microns. One micron is equal to $1 \times 10^{-6}$ meters.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

Elements of the various embodiments described above can be combined, and further modifications can be made, to provide further embodiments without deviating from the spirit and scope of the invention. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification, but should be construed to include all possible embodiments along with the full scope of equivalents to which such claims are entitled. Accordingly, the claims are not limited by the disclosure.

The invention claimed is:

1. A method, comprising:
   forming a plurality of blind apertures into a first surface of a reconstituted wafer in which a plurality of semiconductor material dies are embedded;
   depositing a dry film resist on the first surface of the reconstituted wafer and over the blind apertures;
   exposing the blind apertures by patterning the dry film resist; and
   filling the blind apertures with conductive paste.

2. The method of claim 1 wherein filling the blind apertures comprises forming a contact pad of conductive paste at an end of each of the plurality of blind apertures and on the first surface of the reconstituted wafer.

3. The method of claim 2 wherein forming a contact pad comprises defining a thickness of the contact pad according to a thickness of a resist layer of the dry film resist.

4. The method of claim 3 wherein the thickness of the contact pad is less than 40 microns.

5. The method of claim 3 wherein the thickness of the contact pad is less than 20 microns.

6. The method of claim 3 wherein the thickness of the contact pad is less than 10 microns.

7. The method of claim 3 wherein defining the thickness of the contact pad according to the thickness of the resist layer comprises wiping a bead of conductive paste across the first surface of the reconstituted wafer and over the resist layer so as to fill openings of the resist layer with conductive paste.

8. The method of claim 1 wherein filling the blind apertures comprises filling the blind apertures in a reduced-pressure atmosphere.

9. The method of claim 1, wherein filling the blind apertures forms a plurality of conductive posts in the blind apertures, respectively, the method comprising:
   removing the dry film resist;
   forming contact pads on surfaces of each of the plurality of semiconductor material dies;
   depositing a conductive layer on the first surface of the reconstituted wafer, the conductive layer being in electrical contact with the plurality of conductive posts and the contact pads; and
   patterning the conductive layer, the patterning including forming a plurality of conductive traces extending from respective ones of the contact pads to respective ones of the conductive posts.

10. The method of claim 9, comprising depositing and patterning a dielectric layer after removing the dry film resist and before depositing the conductive layer.

11. The method of claim 9 wherein patterning the conductive layer further comprises forming a plurality of conductive bonding pads on the first surface of the reconstituted wafer, each bonding pad being in electrical contact with either a respective one of the contact pads of the plurality of semiconductor material dies or with a respective one of the plurality of conductive posts.

12. The method of claim 11, comprising forming a plurality of solder balls on respective ones of the plurality of conductive bonding pads.

13. The method of claim 1, wherein filling the blind apertures forms a plurality of conductive posts in the blind apertures, respectively, the method comprising thinning the reconstituted wafer by removing material from a second surface of the reconstituted wafer and exposing respective ends of the conductive posts.

14. The method of claim 13, comprising, after thinning the reconstituted wafer, forming contact pads on the second surface of the reconstituted wafer and in electrical contact with respective ones of the plurality of conductive posts.

15. A method, comprising:
   adhering, over a first surface of a semiconductor wafer, a sheet of dry film resist;
   defining a plurality of openings in a resist layer of the sheet of dry film resist, the defining including patterning the sheet of dry film resist;
   removing a backing layer of the sheet of dry film resist, leaving the resist layer on the first surface;
   drawing a quantity of electrically conductive paste across the reconstituted wafer and over the resist layer and wiping a surface of the resist layer, the drawing including filling each of the plurality of openings while leaving the surface of the resist layer substantially clean of the conductive paste;
   curing the conductive paste in each of the plurality of openings; and
   removing the resist layer from the first surface while leaving a plurality of segments of cured conductive paste on the first surface, having respective shapes as imposed by shapes of the respective ones of the plurality of openings, and having a thickness imposed by a thickness of the resist layer.

16. The method of claim 15 wherein the thickness of the plurality of segments is not greater than about 10 microns.

17. The method of claim 15, further comprising forming a plurality of apertures extending into the semiconductor wafer from the first surface, each aperture being in a position corresponding to a position of a respective one of the plurality of openings, and wherein the drawing includes filling each of the plurality of apertures with conductive paste.

18. The method of claim 15 wherein each of the plurality of apertures is a blind aperture having a high aspect ratio.

19. The method of claim 15 wherein the drawing and wiping comprises drawing an elastomeric blade across the surface of the resist layer, wherein drawing the elastomeric blade includes forcing the conductive paste into each of the plurality of openings and substantially cleaning conductive paste from the surface of the resist layer.

* * * * *